(12) United States Patent
Nicolescu et al.

(10) Patent No.: US 9,841,975 B2
(45) Date of Patent: Dec. 12, 2017

(54) METHOD AND APPARATUS FOR PERFORMING REGISTER ALLOCATION

(71) Applicants: Andreea Florina Nicolescu, Ors. Chitila (RO); Rene Catalin Palalau, Bucharest (RO)

(72) Inventors: Andreea Florina Nicolescu, Ors. Chitila (RO); Rene Catalin Palalau, Bucharest (RO)

(73) Assignee: NXP USA, Inc., Austin, TX (US)

( * ) Notice: Subject to any disclaimer, the term of this patent is extended or adjusted under 35 U.S.C. 154(b) by 112 days.

(21) Appl. No.: 14/917,962

(22) PCT Filed: Sep. 18, 2013

(86) PCT No.: PCT/IB2013/058637
§ 371 (c)(1),
(2) Date: Mar. 10, 2016

(87) PCT Pub. No.: WO2015/040453
PCT Pub. Date: Mar. 26, 2015

(65) Prior Publication Data
US 2016/0224343 A1 Aug. 4, 2016

(51) Int. Cl.
*G06F 9/44* (2006.01)
*G06F 9/45* (2006.01)
(Continued)

(52) U.S. Cl.
CPC .......... *G06F 9/30098* (2013.01); *G06F 8/441* (2013.01); *G06F 9/30145* (2013.01);
(Continued)

(58) Field of Classification Search
CPC .......... G06F 8/441; G06F 8/447; G06F 9/501; G06F 9/5038; G06F 17/5045; G06T 1/20; G06T 11/20
See application file for complete search history.

(56) References Cited

U.S. PATENT DOCUMENTS 4,571,678 A * 2/1986 Chaitin .................. G06F 8/441
717/144
5,046,023 A * 9/1991 Katsura ................... G06T 1/20
345/443
(Continued)

OTHER PUBLICATIONS

Preston Briggs, Register Allocation via Graph Coloring , Apr. 1992, [Retrieved on Aug. 29, 2017]. Retrieved from the internet: <URL: http://www.cs.utexas.edu/~mckinley/380C/lecs/briggs-thesis-1992.pdf> 154 Pages (1-113).*

(Continued)

*Primary Examiner* — Thuy Dao
*Assistant Examiner* — Anibal Rivera

(57) ABSTRACT

A method is provided of performing register allocation for at least one program code module. The method includes constructing a restriction graph for program variables within at least one program instruction, and determining whether the constructed restriction graph is colorable. If it is determined that the constructed restriction graph is not colorable, then the method determines whether at least one alternative form of the at least one program instruction is available, and modifies the at least one program instruction to comprise an alternative form if it is determined that at least one alternative form is available.

9 Claims, 3 Drawing Sheets

(51) Int. Cl.
*G06F 9/30* (2006.01)
*G06F 9/50* (2006.01)
*G06F 17/50* (2006.01)

(52) U.S. Cl.
CPC ............ *G06F 9/5038* (2013.01); *G06F 8/447* (2013.01); *G06F 17/5045* (2013.01)

(56) References Cited

U.S. PATENT DOCUMENTS

| | | | | |
|---|---|---|---|---|
| 5,249,295 | A * | 9/1993 | Briggs | G06F 8/441 717/109 |
| 5,530,866 | A * | 6/1996 | Koblenz | G06F 8/441 717/144 |
| 5,717,440 | A * | 2/1998 | Katsura | G06T 1/20 345/501 |
| 5,784,066 | A * | 7/1998 | Aizikowitz | G06F 8/441 345/440 |
| 5,794,016 | A * | 8/1998 | Kelleher | G06T 1/20 345/505 |
| 6,385,757 | B1 * | 5/2002 | Gupta | G06F 17/5045 716/102 |
| 6,408,428 | B1 * | 6/2002 | Schlansker | G06F 17/5045 716/104 |
| 6,457,173 | B1 * | 9/2002 | Gupta | G06F 9/30156 712/E9.028 |
| 7,589,719 | B2 * | 9/2009 | Owens | G06F 9/5038 345/419 |
| 9,098,298 | B2 | 8/2015 | Ditu et al. | |
| 2005/0039175 | A1 * | 2/2005 | Tatge | G06F 8/441 717/156 |
| 2005/0210457 | A1 * | 9/2005 | Guilford | G06F 11/3624 717/140 |
| 2007/0022413 | A1 * | 1/2007 | Sule | G06F 8/441 717/140 |
| 2007/0038984 | A1 * | 2/2007 | Gschwind | G06F 8/447 717/136 |
| 2008/0005722 | A1 * | 1/2008 | Matsuzaki | G06F 8/441 717/122 |
| 2008/0052694 | A1 * | 2/2008 | Lee | G06F 8/441 717/151 |
| 2010/0328334 | A1 * | 12/2010 | Chen | G06T 1/20 345/589 |
| 2012/0060011 | A1 * | 3/2012 | Belanger | G06F 8/441 711/170 |
| 2013/0139135 | A1 * | 5/2013 | Ditu | G06F 8/441 717/156 |

OTHER PUBLICATIONS

David Callahan et al., Register Allocation via Hierarchical Graph Coloring, Jun. 1991, [Retrieved on Aug. 29, 2017]. Retrieved from the internet: <URL: http://dl.acm.org/citation.cfm?id=113462> 12 Pages (192-203).*

International Search Report for the International application No. PCT/IB2013/058637 dated Apr. 29, 2014.

Smith, Michael D. et al.: "Graph-Coloring Register Allocation for Irregular Architectures", Submitted to PLDI'01, webpage: http://www.cs.tufts.edu/~nr/cs257/archive/mike-smith/irreg.pdf., pp. 1-8, 2000.

* cited by examiner

METHOD AND APPARATUS FOR PERFORMING REGISTER ALLOCATION

FIELD OF THE INVENTION

This invention relates to a method and apparatus for performing register allocation, and in particular to a method and apparatus for performing register allocation as part of a compiler optimization process.

BACKGROUND OF THE INVENTION

In compiler optimization, register allocation is the process of assigning program variables to physical registers of a target processing platform. Register allocation can be performed over a basic block (local register allocation), over a whole function/procedure (global register allocation), or across function boundaries (inter-procedural register allocation).

Not all variables are in use (or "live") at the same time during execution of a program, so some registers may be assigned to more than one variable. However, two variables in use at the same time cannot be assigned to the same register without corrupting its value. Variables which cannot be assigned to some register must be kept in RAM (Random Access Memory) and loaded in/out for every read/write; a process known as "spilling" which requires additional transfer instructions to be added to the program code. Accessing RAM is significantly slower than accessing registers and slows down the execution speed of the compiled program. As such, it is desirable for an optimizing compiler to assign as many variables to registers as possible in order to minimise the amount of spilling required.

SUMMARY OF THE INVENTION

The present invention provides a method of performing register allocation, a computer system comprising at least one signal processing module arranged to perform register allocation, and a non-transitory computer program product having executable program code stored therein for performing register allocation as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

Figure 1:
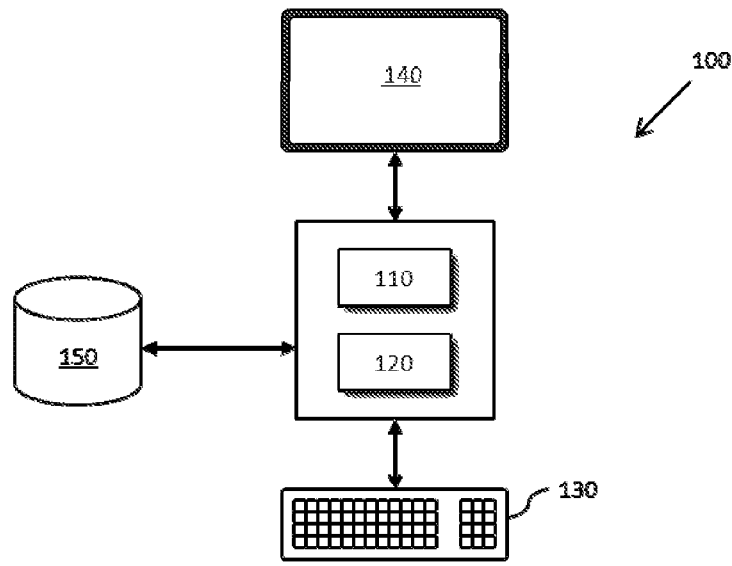
FIG. 1 illustrates a simplified block diagram of an example of a computing system.

The present invention will now be described with reference to the accompanying drawings, and in particular is described with reference to a method and apparatus for performing register allocation as part of compiler optimization. However, it will be appreciated that the present invention is not limited to the specific examples herein described. For example, it is contemplated that in some examples the method of the present invention for performing register allocation may be implemented as a discrete process, and in particular is not limited to being implemented as an integral part of compiler optimization.

Furthermore, because the illustrated embodiments of the present invention may for the most part, be implemented using electronic components and circuits known to those skilled in the art, details will not be explained in any greater extent than that considered necessary as illustrated below, for the understanding and appreciation of the underlying concepts of the present invention and in order not to obfuscate or distract from the teachings of the present invention.

According to some examples of a first aspect of the present invention, there is provided a method of performing register allocation for at least one program code module. The method comprises constructing a restriction graph for program variables within at least one program instruction, and determining whether the constructed restriction graph is colourable. The method further comprises, if it is determined that the constructed restriction graph is not colourable, determining whether at least one alternative form of the at least one program instruction is available, and modifying the at least one program instruction to comprise an alternative form if it is determined that at least one alternative form is available.

In this manner a colourable restriction graph may be achieved through the use of alternative forms of program instructions, reducing the need to add transfer instructions to the program code to achieve a colourable restriction graph.

In some examples, the method may comprise, if it is determined that the constructed restriction graph is not colourable, identifying a set of instructions comprising at least one program instruction comprising program variables connected to an edge of the constructed restriction graph to be broken, determining whether at least one alternative form of at least one program instruction within the identified set of instructions is available, and modifying at least one program instruction within the identified set of instructions to comprise an alternative form if it is determined that at least one alternative form of at least one program instruction within the identified set of instructions is available.

In some examples, the method may comprise, if it is determined that at least one alternative form is available, determining whether a restriction graph updated to take into account the alternative form of the at least one program instruction is colourable, and modifying the at least one program instruction to comprise the alternative form, if it is determined that such an updated restriction graph is colourable.

In some examples, the method may comprise, if it is determined that such a restriction graph updated to take into account the alternative form of the at least one program instruction is not colourable, determining whether at least one further alternative form of the at least one program instruction is available, determining whether a restriction graph updated to take into account the further alternative form of the at least one program instruction is colourable, and modifying the at least one program instruction to comprise the further alternative form, if it is determined that such an updated restriction graph is colourable.

In some examples, the method may comprise progressively updating the constructed restriction graph in accordance with alternative forms of the at least one program instruction until a colourable restriction graph is achievable.

In some examples, the method may comprise, if a colourable restriction graph is not achievable following progressively updating the restriction graph in accordance with all available alternative forms of the program instructions comprising variables within the restriction graph, progressively reverting back to previous configurations of program instruction forms until an alternative form of at least one program instruction comprising variables within the restriction graph that produces a new configuration of program instruction forms is available, determining whether a restriction graph updated to take into account the alternative form of the at least one program instruction that produces a new configuration of program instruction forms is colourable, and modifying the program instructions comprising variables within the restriction graph to comprise the new configuration of program instruction forms, if it is determined that such an updated restriction graph is colourable.

In some examples, the method may comprise adding transfer instructions to the at least one program code module to achieve a colourable restriction graph if no alternative form of a program instruction comprising variables within the restriction graph that produces a new configuration of program instruction forms becomes available when progressively reverting back to previous configurations of program instruction forms.

According to some examples of a second aspect of the present invention, there is provided a computer system comprising at least one signal processing module. The at least one signal processing module is arranged to construct a restriction graph for program variables within at least one program instruction, and determine whether the constructed restriction graph is colourable. The at least one signal processing module is further arranged to, if it is determined that the constructed restriction graph is not colourable, determine whether at least one alternative form of the at least one program instruction is available, and modify the at least one program instruction to comprise an alternative form if it is determined that at least one alternative form is available.

According to some examples of a third aspect of the present invention, there is provided a non-transitory computer program product having executable program code stored therein for performing register allocation. The program code is operable for, constructing a restriction graph for program variables within at least one program instruction, and determining whether the constructed restriction graph is colourable. L The program code is further operable for, if it is determined that the constructed restriction graph is not colourable, determining whether at least one alternative form of the at least one program instruction is available, and modifying the at least one program instruction to comprise an alternative form if it is determined that at least one alternative form is available.

Referring now to FIG. 1, there is illustrated a simplified block diagram of an example of a computing system 100 such as may be adapted in accordance with examples of the present invention. Those skilled in the relevant art will also recognize how to implement the invention using other computer systems or architectures. Computing system 100 may represent, for example, a desktop, laptop or notebook computer, hand-held computing device (PDA, cell phone, palmtop, etc.), mainframe, server, client, or any other type of special or general purpose computing device as may be desirable or appropriate for a given application or environment. Computing system 100 comprises one or more signal processing modules, such as signal processing module 110, and one or more memory elements, such as memory element 120. The computing system 100 may further comprise user interface components such as, in the illustrated example, one or more user input devices such as keyboard 130 and one or more output devices such as display 140. The computer system 100 may further be operably coupled to one or more data storage devices 150.

For completeness, the signal processing module(s) 110 may be arranged to execute computer program code stored within one or more memory element(s), such as the memory element 120. The memory element(s) 120 may comprise any form of non-transitory computer program product, such as a hard disk, a CD-ROM, an optical storage device, a magnetic storage device, a Read Only Memory (ROM), a Programmable Read Only Memory (PROM), an Erasable Programmable Read Only Memory (EPROM), an Electrically Erasable Programmable Read Only Memory (EEPROM), and a Flash memory.

Figure 2:
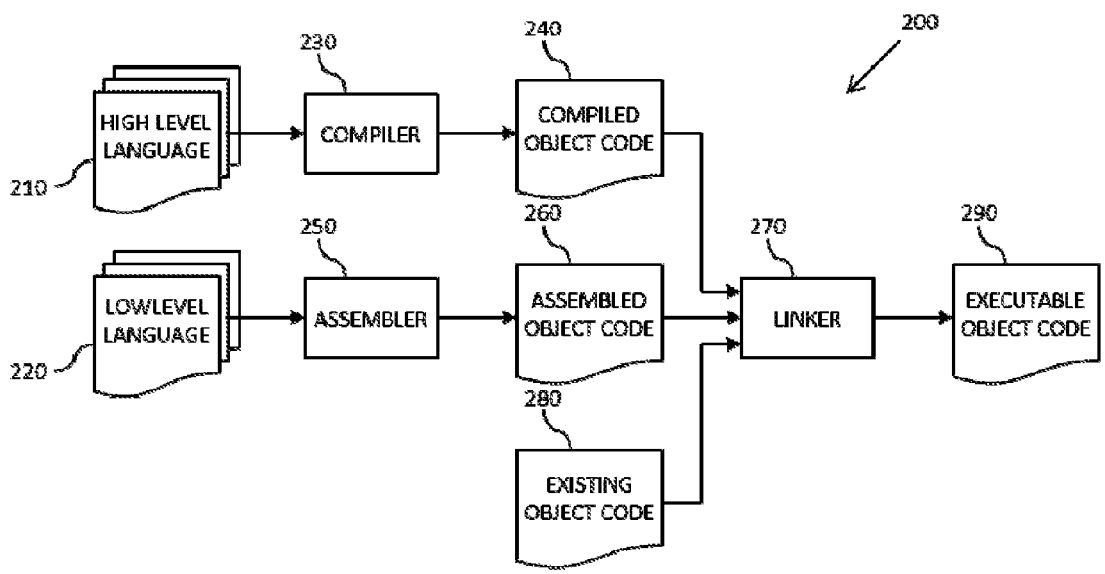
FIG. 2 illustrates a simplified block diagram of an example of a typical computer program code generation process.

Referring now to FIG. 2, there is illustrated a simplified block diagram of an example of a typical computer program code generation process 200, such as may be at least partly carried out within the computer system 100 illustrated in FIG. 1, for example by way of computer program code executing on the signal processing module(s) 110. Source code files are created by, for example, one or more programmers. Such source code files may be created in one or more high level languages and/or one or more low level (e.g. assembly) languages. Accordingly, the computer program code generation process 200 may involve one or more high level language source code file(s) 210 and/or one or more low level language source code file(s) 220.

In the case of the high level language source code file(s) 210, a compiler 230 converts the high level language source code into another target language, and typically into object code 240 comprising a binary form executable on a target processing architecture. In the case of the low level (assembly) language code file(s) 220, an assembler 250 converts the low level language source code into object code 260 executable on the target processing architecture.

Compilers, such as compiler 230 illustrated in FIG. 2, enable the development of programs that are machine-independent using high level, abstract programming languages. The use of high level languages to generate source code permits the use of generic, high level instructions and symbolic variables, and does not require the programmer to consider the use of machine specific instruction sets or physical registers etc. In contrast, low level languages such as assembly languages are typically machine dependent, and low level language source code is required to be rewritten if the program is to be executed on difference computer hardware architectures. However, low level languages provide a programmer with a very strong (generally one-to-one) correspondence between the language and the architecture's machine code instructions and physical registers; often an important factor with real-time program code.

A linker 270 'links' object code modules, such as compiled object code modules 240 and/or assembled object code modules 260 and/or pre-existing object code modules 280, into executable object code 290.

The majority of computer program code is generated using high level programming languages due to the machine independent nature of the high level source code and the high level, abstract nature of the programming languages that are more user friendly than the lower level programming languages. As previously mentioned, the compiler 230 converts the high level language source code into another target language, and typically into object code 240 comprising a binary form executable on a target processing architecture. This process of converting high level language source code into, say, object code may involve various separate operations including, by way of example, lexical analysis and pre-processing, parsing and semantic analysis (syntax-directed translation), and code generation and optimization.

In code optimization, register allocation is the process of assigning a potentially large number of program variables to a small number of physical registers available on the target processing architecture. Variables in use at the same time cannot be assigned to the same register without corrupting its value. Variables which cannot be assigned to some register must be kept in RAM (Random Access Memory) and loaded in/out for every read/write; a process known as "spilling" which requires additional transfer instructions to be added to the program code. Accessing RAM is significantly slower than accessing registers and slows down the execution speed of the compiled program. As such, it is desirable for an optimizing compiler to assign as many variables to registers as possible in order to minimise the amount of spilling required. Spilling may also apply when more than one register class exists (for instance different register classes may be provided for where not all instructions work the same way with all registers). In the case of multiple register classes, it may be possible to 'spill' one variable from one register class (which has high usage relative to the number of physical registers) to another register class (which has lower usage relative to the number of physical registers) instead of spilling it in memory.

Figure 3:
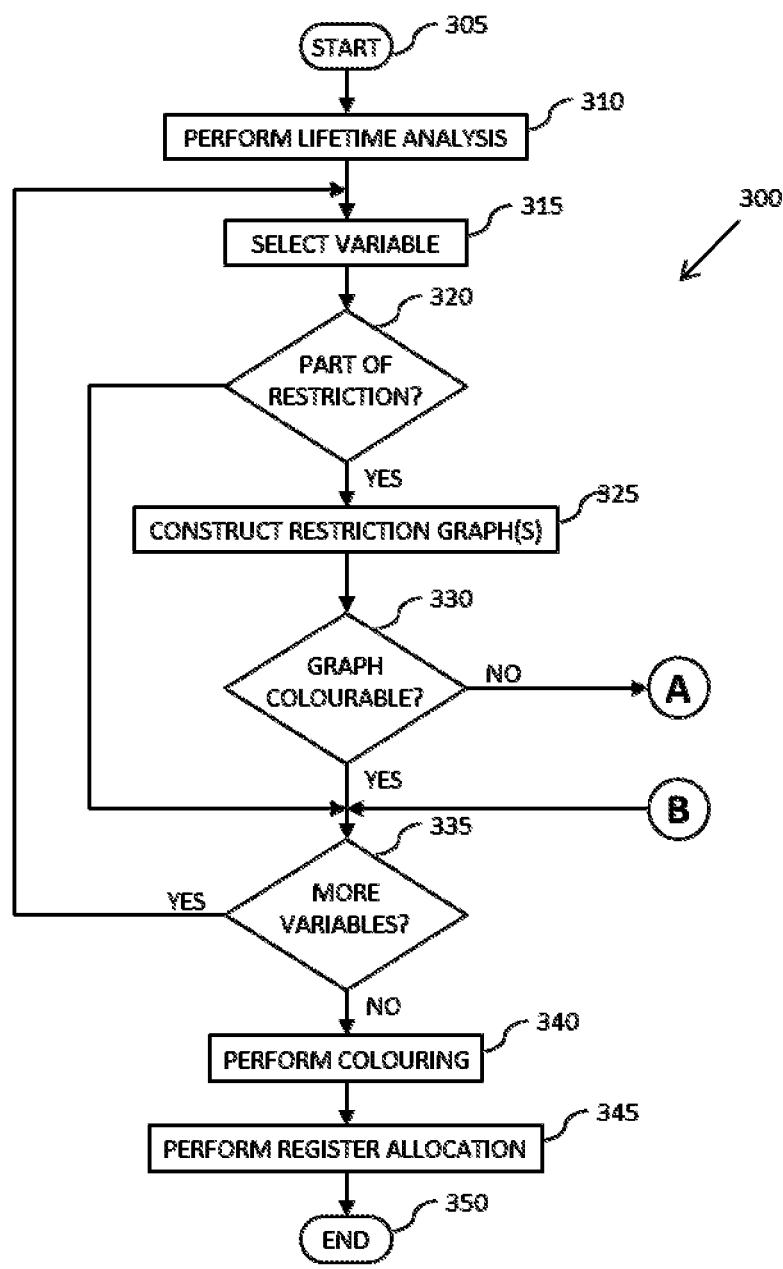
FIGS. 3 and 4 illustrate simplified flowcharts of an example of a method for performing registers allocation.
Figure 4:
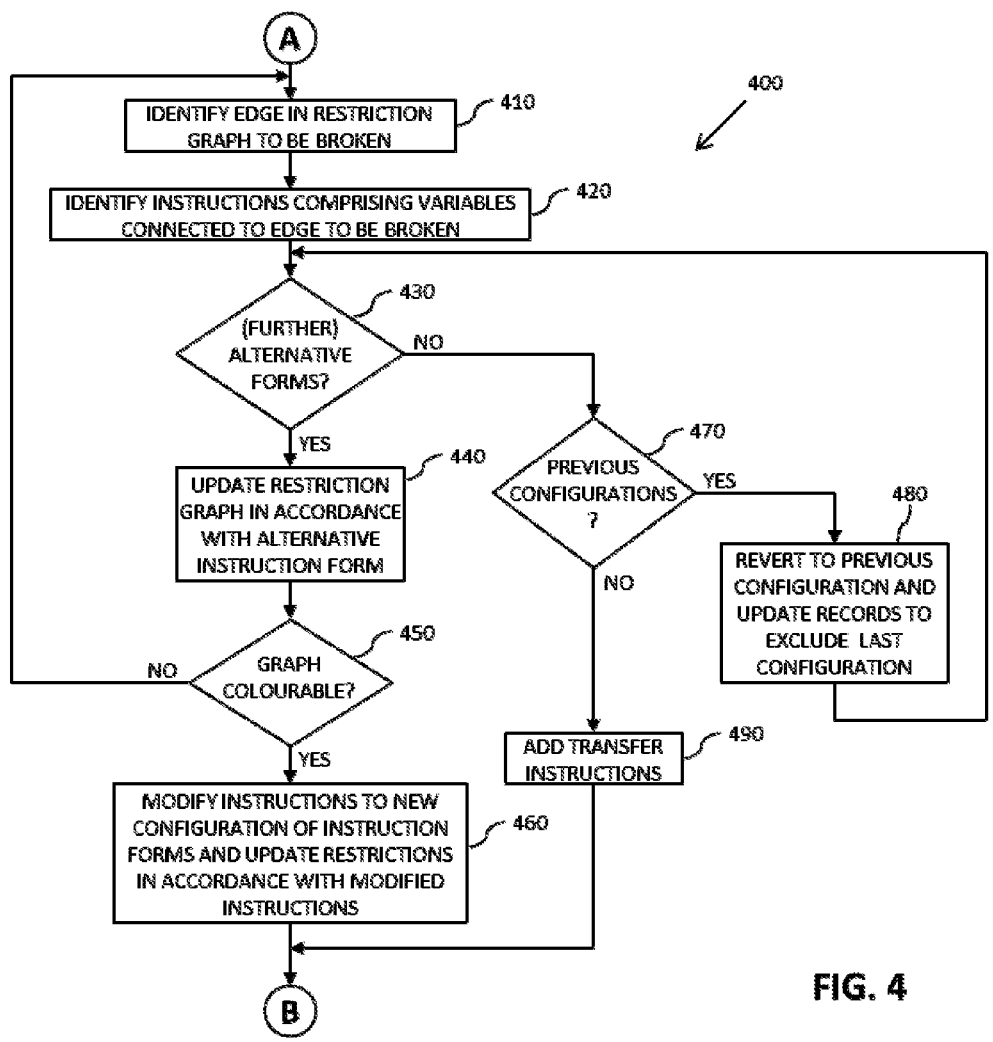

Referring now to FIGS. 3 and 4, there are illustrated simplified flowcharts 300, 400 of an example of a method for performing register allocation, such as may be performed by the compiler 230 illustrated in FIG. 2. The method starts at 305 in FIG. 3, for example following generation of an intermediate representation of the program code, and moves on to 310 where live variable analysis is performed for the respective program code for which register allocation is being performed. Live variable analysis (or simply lifetime analysis) is a data flow analysis performed by a compiler to calculate for each program point the variables that may be potentially read before their next write; i.e. variables that are 'live' at the exit from each program point. Put simply, a variable is 'live' if it holds a value that may be needed in the future. Through such lifetime analysis, sets of variables that are live at the same time during execution of the program code are determined, and lifetime interference between variables (i.e. instances where multiple variables are live at the same time during execution of the program code) may be identified.

Having performed the lifetime analysis, the method then moves on to 315 where a (first) program variable is selected. In some examples, each program variable may have been assigned to a virtual register within the intermediate representation of the program code. Accordingly, this step of selecting a variable (and equally other actions performed in relation to one or more program variables) may be performed in relation to the respective virtual register(s). Next, at 320, it is determined whether the selected variable is part of a restriction, for example whether there exists a lifetime interference between that variable and one or more further variables, and whether that variable is present within at least one 'restricted' operand of at least one instruction. Such restricted operands may require, for example, variables to be assigned to multiple registers that have a specific positioning relative to one another, such as a pair of (logically) adjacent registers or two registers (logically) spaced a fixed distance apart. An example of such a restricted operand is: add.2 a:b, c:d, where the variables within register pairs a:b and c:d may be restricted such that variable b must be allocated to the next register after a, and variable d must be allocated to the next register after c. It will be appreciated that such relative position of registers is not necessary reliant on the physical location of each register within the semiconductor die, but rather to the 'logical' order of the individual registers.

If it is determined that selected variable is not part of a restriction, then it may be assumed that no restrictions exist in relation to the allocation of that variable to a physical register within the target processing architecture. As such, in the illustrated example the method moves on to 335 where it is determined whether there are any more further program variables for which assessment of register allocation is required to be performed. If it is determined that there is/are one or more further program variable(s) for which assessment of register allocation is required to be performed, the method loops back to 315, where a next program variable is selected.

Referring back to 320, if it is determined that the currently selected program variable is part of a restriction, for example there exists a lifetime interference between that variable and one or more further variables, the method moves on to 325 where a restriction graph is constructed. For example, a restriction graph may be constructed covering all (or a plurality of) identified restricted lifetime interferences that exists for the selected program variable. Alternatively, a separate restriction graph may be constructed for each individual restricted lifetime interference that exists for the selected program variable.

A restriction graph comprises a directed graph whereby every vertex represents a unique variable to be allocated to a register (if possible). In particular, a restriction graph may comprise vertices representing, for example, the selected variable and all other variables for which there exists a lifetime interference with the selected variable. In some scenarios, some of the variables for which there exists a lifetime interference with the selected variable may have lifetime interferences with still further variables, which in turn may have lifetime interferences with still further variables, and so on. As such, a chain or network of overlapping lifetime interferences may exist with the selected variable. As such, in some examples, a restriction graph may comprise vertices representing the selected variable and all other variables within the chain/network of overlapping lifetime interferences.

Interference edges connect pairs of vertices (variables) which are live at the same time during execution of the program code. Other restrictions may also be represented within the restriction graph by way of weighting values/labels assigned to the interference edges and/or to the vertices (variables) themselves.

Having constructed the restriction graph(s), the method moves on to 330 where a colourability check is performed on the, or each, restriction graph. Graph colouring is a well-known technique in graph theory for graph labelling, and involves the assignment of labels (colours) to elements of a graph subject to certain constraints. Graph colouring is a technique that has been widely used in register allocation as a way of 'colouring' the vertices of a restriction graph such that no two adjacent vertices share the same colour; whereby each physical register of a target processing architecture is represented by a unique colour (or other label). In this manner, graph colouring is used as a technique for assigning program variables to physical registers in such a manner that two program variables in use at the same time are not assigned to the same physical register.

A restriction graph may be said to be colourable if it is possible to colour all vertices of the restriction graph such that no two adjacent vertices share the same colour. Various factors may determine whether a restriction graph is colourable, the most basic factors being the number of vertices and their respective inter-connections (i.e. the number and configuration of edges between the vertices), and the number of available colours. In register allocation, other restrictions are often also required to be taken into consideration for certain program variables. For example, instructions may require variables to be assigned to multiple registers that have a specific positioning relative to one another, such as a pair of (logically) adjacent registers or two registers (logically) spaced a fixed distance apart. It will be appreciated that such relative position of registers is not necessary reliant on the physical location of each register within the semiconductor die, but rather to the 'logical' order of the individual registers. As mentioned above, such restrictions may be represented within the restriction graph by way of weighting values/labels assigned to the interference edges and/or to the vertices (variables) themselves.

Many graph colouring algorithms have been developed for register allocation, as well as for other graph colouring applications, and any suitable algorithm may be used to determine whether the restriction graph is colourable; the choice of algorithm often being dependent on the restrictions required to be represented within the particular restriction graph. The selection and implementation of such algorithms is well known in the art, and any experienced person would be capable of selecting and implementing an appropriate algorithm for determining the colourability of a restriction graph. As such, it is not necessary to describe this in any greater detail herein. Nevertheless, for completeness, in some examples only a partial colourability check may be performed at 330, for example with respect to restrictions imposed by restricted operands associated with the respective restriction graph. For example, in a restriction graph, any two nodes may be connected either by an edge (corresponding to a restriction) with a fixed distance, or by a chain of edges. As such, the restriction graph may be colourable if it is possible to assign a colour to each node while respecting all the edge distances. Such a check may be performed by first assigning a colour (for instance '0') to a node, and then assigning colours as determined by the chains to the other nodes (e.g. by a depth first or breadth first graph traversal). Each node colour may then be checked against the colours of its neighbours. If each pair of neighbour nodes has a difference of colour equal to the respective edge distance then the graph is colourable. Thus, in determining whether the restriction graph is colourable at 330, it is not necessary at this stage to perform the full graph colouring (i.e. to assign a unique colour to each of the vertices in the restriction graph), but only to determine whether it is possible to 'colour' the restriction graph such that no two adjacent vertices share the same colour (i.e. that no two registers live at the same time share the same physical register), and that any restrictions are adhered to.

If it is determined that the restriction graph is colourable, the method moves on to 335 where it is determined whether there are any more further program variables for which assessment of register allocation is required to be performed. If it is determined that there is/are one or more further program variable(s) for which assessment of register allocation is required to be performed, the method loops back to 315, where a next program variable is selected.

Referring back to 330, if it is determined that the restriction graph is not colourable, conventionally at this point in the register allocation process transfer instructions would be added to the program code, for example to transfer variables between registers or if necessary to 'spill' some of the variables to RAM in order to enable a restriction graph for the resulting program code to be colourable. However, transferring variables between registers or spilling variables to RAM in this manner is undesirable.

In the illustrated example, if it is determined that the restriction graph is not colourable, the method moves on to 410 in the flowchart 400 of FIG. 4, where an edge in the restriction graph to be broken is identified. For example, in order for the restriction graph to be broken, all vertices of the restriction graph must be 'coloured' (i.e. assigned to a physical register) such that no two adjacent vertices share the same colour. Accordingly, since it has previously been determined that the restriction graph is no colourable, at least two adjacent vertices (i.e. two vertices connected by an edge) must be unable to have different colours. Accordingly, in order for the graph to become colourable, the edge that represents a restriction between the two vertices, such as a lifetime interference or other restriction, needs to be 'broken'.

Having identified an edge in the restriction graph to be broken, the method moves on to 420 where a set of instructions is identified comprising program instructions that comprise the program variables (i.e. the vertices in the restriction graph) connected to the identified edge of the restriction graph to be broken. It is then determined whether one or more alternative form(s) of at least one program instruction from the identified set of program instructions is/are available, at 430. As is well known in the art, an instruction set for a processing architecture may comprise multiple different forms of an instruction for performing a particular operation. For example, the instruction set for the target processing architecture may comprise, say, an addition instruction that has a first form that comprises a pair of variables that are required to be allocated to a pair of (logically) adjacent registers. The addition instruction may have a second form in which the variables are required to be allocated to two registers (logically) spaced a fixed distance apart. Furthermore, in a multi-tiered architecture, different forms of a particular instruction may be able to be allocated to different sets of physical registers. Accordingly, at 430 in the flowchart 400 of FIG. 4 it may be determined whether one or more alternative form(s) of at least one program instruction comprising a program variable (vertex in the restriction graph) connected to the identified edge of the restriction graph to be broken, and for which the restriction graph is not colourable, has an alternative form. As recognised by the inventors, such an alternative form of the program instruction may have different register allocation requirements and as such may enable said edge to be broken, enabling the restriction graph to be coloured without the need for transfer instructions to be added to the program code.

Referring back to 430 in FIG. 4, if it is determined that an alternative form of at least one program instruction within the identified set of instructions is available, the method moves on to 440 where a/the alternative form of the at least one program instruction is selected and the restriction graph is updated in accordance with the selected alternative form of the program instruction. As described in greater detail below, a record of each configuration of program instructions for which the restriction graph is constructed and updated may be maintained to enable modifications to instructions to be tracked.

Having updated the restriction graph, it is then determined whether the updated restriction graph is colourable, at 450. If it is determined that the updated restriction graph is colourable, the method moves on to 460 where the program code is modified to incorporate the latest configuration of program instruction forms, and register restrictions etc. used to construct restriction graphs for the program code are also updated accordingly. Having achieved a configuration of instruction forms that enables a colourable restriction graph to be constructed, the method may then return to 335 in FIG. 3 where it is determined whether there are any further program variables for which assessment of register allocation is required to be performed.

Thus, in this manner a colourable restriction graph may be achieved through the use of alternative forms of program instructions, enabling the need to transfer instructions to be added to the program code to be avoided where possible.

Referring back to 450, if it is determined that the updated restriction graph is not colourable, the method loops back to 410 where an edge in the (updated) restriction graph to be broken is identified. It will be appreciated that the previously identified edge to be broken may or may not have successfully been broken by the modification to the alternative form of the program instruction. If the previously identified edge was not successfully broken, then upon looping back to 410, the same edge may be identified to be broken. The method then moves on to 420 where the set of instructions is identified comprising program instructions that comprise the program variables (i.e. the vertices in the restriction graph) connected to the identified edge of the restriction graph to be broken. In the case where it is the same edge in the restriction graph that is to be broken, the same set of instructions will also be identified for the same program variables. It is then determined whether one or more further (i.e. not previously used) alternative form(s) of at least one program instruction from the identified set of program instructions is/are available, at 430. As previously mentioned, a record of each configuration of program instructions for which the restriction graph is constructed and updated may be maintained to enable modifications to instructions to be tracked. Accordingly, such a record may be used to ensure a configuration of program instruction forms is not repeated.

Referring back to 410, if the previously identified edge was successfully broken, then a new edge in the updated restriction graph to be broken is identified, and a new set of program instructions comprising program instructions that comprise the program variables connected to the new identified edge of the restriction graph to be broken is identified at 420.

In this manner, the method of the illustrated example may loop through 410 to 450 until a colourable restriction graph is achieved at 450 or until no further (untried) alternative forms of the program instructions from the identified set of program instructions are available, at 430. Thus, in the illustrated example, the method comprises progressively updating the constructed restriction graph in accordance with alternative forms of program instructions until a colourable restriction graph is achievable. If for the identified set of program instructions no further (untried) alternative forms of the program instructions within the set are available, the method in the illustrated example moves on to 470 where it is determined whether a restriction graph was constructed/updated for any previous configurations of program instruction forms for the identified set of instructions. If it is determined that a restriction graph was constructed/updated for at least one previous configuration of program instruction forms for the identified set of instructions (such a restriction graph having been determined to be un-colourable at 330 or 450), the method moves on to 480 where in the illustrated example the method reverts back to the immediately previous configuration of program instruction forms (i.e. the last change to a program instruction form is undone). The records of configurations of program instructions for which the restriction graph has been constructed/updated are also updated to exclude the last configuration. The method then loops back to 430 where it is determined whether, following reverting back to the previous configuration, alternative form(s) of at least one program instruction from the identified set of program instructions is/are available.

In this manner, the method illustrated in FIG. 4 may loop through 430, 470 and 480 until a previous configuration is reverted back to for which an alternative form of at least one program instruction from the identified set of program instructions is available, at 430, or until no further previous configurations of program instruction forms for the identified set of instructions are available, at 470. Thus, in the illustrated example, if a colourable restriction graph is not achievable following progressively updating the restriction graph in accordance with all available alternative forms of the program instructions comprising variables within the restriction graph, the method moves on to progressively reverting back to previous configurations of program instruction forms until an alternative form of at least one program instruction produces a new configuration of program instruction forms.

In the illustrated example, if no further previous configurations of program instruction forms for the identified set of instructions are available, at 470, the method then moves on to 490 where one or more transfer instructions are added to the program code to enable a colourable restriction graph to be achieved. The method then returns to 335 in FIG. 3 where it is determined whether there are any further program variables for which assessment of register allocation is required to be performed.

Thus, in the example illustrated in FIG. 4, only if no configuration of alternative forms of program instructions is found that achieves a colourable restriction graph are transfer instructions added to the program code. In this manner, the use of transfer instructions to enable physical registers to be allocated to program variables may be minimised, minimising the amount of spilling required during execution of the program code, thereby enabling the execution performance of the program code to be improved.

For completeness, referring back to 335 in FIG. 3, once a colourable restriction graph has been achieved for all program variables that form part of a restriction, the method moves on to 340 where colouring of the restriction graphs is performed, and register allocation is then performed at 345 where physical registers are assigned to the program variables in accordance with the coloured restriction graphs. The method then ends, at 350.

The invention may be implemented in a computer program for running on a computer system, at least including code portions for performing steps of a method according to the invention when run on a programmable apparatus, such as a computer system or enabling a programmable apparatus to perform functions of a device or system according to the invention.

A computer program is a list of instructions such as a particular application program and/or an operating system. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system.

The computer program may be stored internally on computer readable storage medium or transmitted to the computer system via a computer readable transmission medium. All or some of the computer program may be provided on computer readable media permanently, removably or remotely coupled to an information processing system. The computer readable media may include, for example and without limitation, any number of the following: magnetic storage media including disk and tape storage media; optical storage media such as compact disk media (e.g., CD-ROM, CD-R, etc.) and digital video disk storage media; nonvolatile memory storage media including semiconductor-based memory units such as FLASH memory, EEPROM, EPROM, ROM; ferromagnetic digital memories; MRAM; volatile storage media including registers, buffers or caches, main memory, RAM, etc.; and data transmission media including computer networks, point-to-point telecommunication equipment, and carrier wave transmission media, just to name a few.

A computer process typically includes an executing (running) program or portion of a program, current program values and state information, and the resources used by the operating system to manage the execution of the process. An operating system (OS) is the software that manages the sharing of the resources of a computer and provides programmers with an interface used to access those resources. An operating system processes system data and user input, and responds by allocating and managing tasks and internal system resources as a service to users and programs of the system.

The computer system may for instance include at least one processing unit, associated memory and a number of input/output (I/O) devices. When executing the computer program, the computer system processes information according to the computer program and produces resultant output information via I/O devices.

In the foregoing specification, the invention has been described with reference to specific examples of embodiments of the invention. It will, however, be evident that various modifications and changes may be made therein without departing from the broader spirit and scope of the invention as set forth in the appended claims.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements The mere fact that certain measures are recited in mutually different claims does not indicate that a combination of these measures cannot be used to advantage.

The invention claimed is:

1. A method executed by software instructions on a hardware processor of performing register allocation for at least one program code module, the method comprising:
    constructing a restriction graph for program variables within at least one program instruction; and
    performing at least a partial colourability check of the constructed restriction graph;
    wherein the method further comprises, if it is determined that the constructed restriction graph is not colourable:
    determining whether at least one alternative form of the at least one program instruction is available;
    determining that such a restriction graph updated to take into account the alternative form of the at least one program instruction is not colourable;
    determining whether at least one further alternative form of the at least one program instruction is available;
    determining whether a restriction graph updated to take into account the further alternative form of the at least one program instruction is colourable; and
    progressively updating the constructed restriction graph in accordance with alternative forms of the at least one program instruction until a colourable restriction graph is achievable.

2. The method of claim 1, wherein the method comprises, if it is determined that the constructed restriction graph is not colourable:

identifying a set of instructions comprising at least one program instruction comprising program variables connected to an edge of the constructed restriction graph to be broken;

determining whether at least one alternative form of at least one program instruction within the identified set of instructions is available; and modifying at least one program instruction within the identified set of instructions to comprise an alternative form if it is determined that at least one alternative form of at least one program instruction within the identified set of instructions is available.

3. The method of claim 1, wherein the method further comprises, if it is determined that at least one alternative form is available:

determining whether a restriction graph updated to take into account the alternative form of the at least one program instruction is colourable; and modifying the at least one program instruction to comprise the alternative form, if it is determined that such an updated restriction graph is colourable.

4. The method of claim 1, wherein the method further comprises, if a colourable restriction graph is not achievable following progressively updating the restriction graph in accordance with all available alternative forms of the program instructions comprising variables within the restriction graph:

progressively reverting back to previous configurations of program instruction forms until an alternative form of at least one program instruction comprising variables within the restriction graph that produces a new configuration of program instruction forms is available;

determining whether a restriction graph updated to take into account the alternative form of the at least one program instruction that produces a new configuration of program instruction forms is colourable; and modifying the program instructions comprising variables within the restriction graph to comprise the new configuration of program instruction forms, if it is determined that such an updated restriction graph is colourable.

5. The method of claim 1, wherein the method comprises adding transfer instructions to the at least one program code module to achieve a colourable restriction graph if no alternative form of a program instruction comprising variables within the restriction graph that produces a new configuration of program instruction forms becomes available when progressively reverting back to previous configurations of program instruction forms.

6. The method of claim 1, wherein the at least partial colourability check is performed at least with respect to restrictions imposed by restricted operands associated with the constructed restriction graph.

7. A computer system comprising a hardware processor and at least one signal processing module arranged to perform register allocation, the at least one signal processing module being arranged to:

construct a restriction graph for program variables within at least one program instruction; and determine whether the constructed restriction graph is colourable;

wherein at least one signal processing module is further arranged to, if it is determined that the constructed restriction graph is not colourable:

determine whether at least one alternative form of the at least one program instruction is available;

determine that such a restriction graph updated to take into account the alternative form of the at least one program instruction is not colourable; and determine whether at least one further alternative form of the at least one program instruction is available;

determine whether a restriction graph updated to take into account the further alternative form of the at least one program instruction is colourable; and progressively update the constructed restriction graph in accordance with alternative forms of the at least one program instruction until a colourable restriction graph is achievable.

8. A non-transitory computer program product having executable program code stored therein for performing register allocation, the program code operable for:

constructing a restriction graph for program variables within at least one program instruction; and determining whether the constructed restriction graph is colourable;

wherein the program code is further operable for, if it is determined that the constructed restriction graph is not colourable:

determining whether at least one alternative form of the at least one program instruction is available;

determining that such a restriction graph updated to take into account the alternative form of the at least one program instruction is not colourable;

determining whether at least one further alternative form of the at least one program instruction is available;

determining whether a restriction graph updated to take into account the further alternative form of the at least one program instruction is colourable; and progressively updating the constructed restriction graph in accordance with alternative forms of the at least one program instruction until a colourable restriction graph is achievable.

9. The non-transitory computer program product of claim 8, wherein the non-transitory computer program product comprises at least one from a group including: a hard disk, a CD-ROM, an optical storage device, a magnetic storage device, a Read Only Memory, ROM, a Programmable Read Only Memory, PROM, an Erasable Programmable Read Only Memory, EPROM, an Electrically Erasable Programmable Read Only Memory, EEPROM, and a Flash memory.

* * * * *